United States Patent
Steffen

(10) Patent No.: US 11,204,381 B2
(45) Date of Patent: Dec. 21, 2021

(54) DEVICE AND METHOD FOR DETECTING A MISSING ELECTRICAL CONNECTION OF AN ENERGY STORE TO AN ENERGY-SUPPLY SYSTEM, PARTICULARLY AN ELECTRICAL SYSTEM OF A MOTOR VEHICLE

(71) Applicant: Robert Bosch GmbH, Stuttgart (DE)

(72) Inventor: Roland Steffen, Heimsheim (DE)

(73) Assignee: Robert Bosch GmbH, Stuttgart (DE)

( * ) Notice: Subject to any disclaimer, the term of this patent is extended or adjusted under 35 U.S.C. 154(b) by 164 days.

(21) Appl. No.: 16/323,550

(22) PCT Filed: Jul. 7, 2017

(86) PCT No.: PCT/EP2017/067104
§ 371 (c)(1),
(2) Date: Feb. 6, 2019

(87) PCT Pub. No.: WO2018/046166
PCT Pub. Date: Mar. 15, 2018

(65) Prior Publication Data
US 2019/0195930 A1    Jun. 27, 2019

(30) Foreign Application Priority Data
Sep. 6, 2016   (DE) .......................... 102016216845.2

(51) Int. Cl.
*G01R 31/00* (2006.01)
*G01R 31/52* (2020.01)
*G01R 31/54* (2020.01)

(52) U.S. Cl.
CPC ........... *G01R 31/006* (2013.01); *G01R 31/52* (2020.01); *G01R 31/54* (2020.01)

(58) Field of Classification Search
CPC ...... G01R 31/006; G01R 31/50; G01R 31/52; G01R 31/54
See application file for complete search history.

(56) References Cited

U.S. PATENT DOCUMENTS

2001/0012984 A1   8/2001  Adamiak et al.
2006/0028180 A1*  2/2006  Merkle .................. G01R 31/67
                                                                320/137
(Continued)

FOREIGN PATENT DOCUMENTS

CN     103010130 A    4/2013
CN     105048613 A   11/2015
(Continued)

OTHER PUBLICATIONS

International Search Report for PCT/EP2017/067104, dated Nov. 7, 2017.

*Primary Examiner* — Son T Le
*Assistant Examiner* — Adam S Clarke
(74) *Attorney, Agent, or Firm* — Norton Rose Fulbright Us LLP; Gerard Messina

(57) ABSTRACT

A device and a method for detecting a missing electrical connection of an energy store to an energy-supply system, particularly an electrical system of a motor vehicle, in which at least one current-sensing device senses at least one current flowing in the energy-supply system or energy store, at least one dispersion of the current being determined and compared to at least one threshold value in order to detect a missing electrical connection of the energy store to the energy-supply system.

16 Claims, 2 Drawing Sheets

(56) References Cited

U.S. PATENT DOCUMENTS

| | | | |
|---|---|---|---|
| 2009/0128157 A1* | 5/2009 | Moriya | G01R 31/3842 |
| | | | 324/426 |
| 2013/0271086 A1* | 10/2013 | Mitsutani | B60L 58/10 |
| | | | 320/134 |
| 2014/0354292 A1 | 12/2014 | Hiti et al. | |
| 2016/0349301 A1* | 12/2016 | Wortberg | G01R 31/40 |
| 2017/0114741 A1* | 4/2017 | Ito | G01R 31/3647 |
| 2017/0125995 A1* | 5/2017 | Nishi | H02J 7/0063 |
| 2019/0178230 A1* | 6/2019 | Sulzer | G01R 31/52 |
| 2019/0225233 A1* | 7/2019 | Tod | G06Q 50/30 |

FOREIGN PATENT DOCUMENTS

| | | |
|---|---|---|
| DE | 102004035513 A1 | 2/2006 |
| DE | 102014116800 A1 | 5/2016 |
| EP | 1990645 A1 | 11/2008 |
| EP | 2658064 A1 | 10/2013 |
| FR | 2960298 A1 | 11/2011 |
| FR | 2967784 A1 | 5/2012 |
| FR | 2970609 A1 | 7/2012 |
| JP | 2003348898 A | 12/2003 |
| JP | 2005181167 A | 7/2005 |
| WO | 2015025089 A1 | 2/2015 |
| WO | 2015145231 A1 | 10/2015 |
| WO | 2015181619 A1 | 12/2015 |

* cited by examiner

DEVICE AND METHOD FOR DETECTING A MISSING ELECTRICAL CONNECTION OF AN ENERGY STORE TO AN ENERGY-SUPPLY SYSTEM, PARTICULARLY AN ELECTRICAL SYSTEM OF A MOTOR VEHICLE

FIELD

The present invention relates to a device and a method for detecting a missing electrical connection of an energy store to an energy-supply system, particularly an electrical system of a motor vehicle.

BACKGROUND INFORMATION

German Patent Application No. DE 102004035513 A1 describes a method for detecting the connection between an energy store and an electrical system of a vehicle. In that case, the generator current and the battery current are sensed, and during a transition period in response to a change in load, the compensation reaction of the battery is evaluated. The state of the connection is inferred from the reaction. For this, it is necessary to sense two currents.

German Patent Application No. DE 102014116800 A1 describes a method for detecting a battery operating within a voltage-supply system of a motor vehicle. In that case, the voltage ripple is determined and evaluated. If the ripple exceeds a threshold value, the absence of the battery is then inferred.

Interruptions outside of the distance between the battery and the voltage-sensing device are not detected in the process.

SUMMARY

An object of the present invention is to further improve the reliability of the detection of a missing electrical connection of an energy store to an energy-supply system. The object may be achieved in accordance with the features of the present invention.

An example device in accordance with the present invention and an example method in accordance with the present invention may have the advantage that a missing connection of one or more electrical energy stores in an electrical energy-supply system, e.g., the electrical system of a motor vehicle, is detected with greater reliability. This is of particular importance just now, given the increasing degree of electrification and automation, especially in motor vehicles, since the demands on the functional reliability of the energy supply are rising there. In case of a missing connection of an energy store, it may be necessary to take countermeasures in a timely manner on the higher system level in order to maintain or restore a safe state of the overall system, while taking a possibly reduced performance capability into account. This is possible by communicating the detected system state to the higher system level. In the event an energy store is disconnected, the dispersion of the current, especially the current through the energy store or the energy-store system, is less than in the fault-free state. The use of the dispersion of the current as criterion for detecting a missing electrical connection between the energy store and the energy-supply system requires only one current sensor with a suitable evaluation unit. Resorting to a dispersion rules out false detections which could be based on offset errors of a current sensor, if only the mean value of the current were utilized as criterion for detecting a missing connection. The evaluation of the mean value is not reliable in other states either, like, for example, in the case of a full, frozen or exhausted battery. On the other hand, by using the dispersion, the probability of false detections is reduced.

In one expedient further development of the present invention, the dispersion of the current is compared to a threshold value that lies preferably in the range of the dispersion of the current-sensing device. A higher value indicates the proper connection of the energy store. Consequently, uncertainties in the sensing of the current are not reflected in a false detection of the connection status of the energy store.

In one useful further development of the present invention, a mean value of the current is determined and compared to a threshold value in order to check the plausibility of the detection of the missing electrical connection of the energy store to the energy-supply system. The danger of spurious trippings is thereby further reduced.

In one expedient further development of the present invention, a missing electrical connection between the energy store and energy-supply system is inferred only if the missing electrical connection is recognized for a certain period of time, especially on the order of 100 ms to 120 s. In this manner, false detections and constant status changes may be avoided. Notably, certain safety shutoffs of the energy store, e.g., during cyclical functional checks, do not lead to false detections.

In one useful further development of the present invention, a state, in which a missing electrical connection between the energy store and energy-supply system is inferred, is terminated if a missing electrical connection between the energy store and the energy-supply system is no longer inferred within a period of time. By introducing what is referred to as a dequalification time or a qualification time, a constant change of the detected state may be prevented. Thus, for example, certain energy stores such as certain battery types, for instance, have a safety shutoff which is checked cyclically for functionality. In so doing, the energy store is deliberately disconnected from the energy-supply system. Typically, this time may lie in a range of 100 ms to 30 s. Given the selection of a suitable qualification time, such states do not lead to false detections. In addition, changes are able to be implemented quickly if the status has changed to an (again) existing connection of the energy store. The danger that unwarranted countermeasures will be triggered is thereby reduced.

In one useful further development, a state, especially an idle state, of the energy-supply system and/or of the motor vehicle is taken into account to further check the plausibility of a missing electrical connection between the energy store and energy-supply system. Thus, in the idle state, certain loads of the motor vehicle are usually switched off in order to minimize energy consumption. The threshold values, which are therefore often not attained, now no longer lead to false detections.

In one expedient further development, the energy-supply system is excited in such a way that the current is changed, preferably by a value which is greater than the threshold value for the dispersion. In particular, preferably the excitation of the energy-supply system is carried out when the previously ascertained dispersion is less than the threshold value. In this manner, after evaluation, a further plausibility check is carried out, so that the danger of false detections is further reduced.

In one useful further development, at least one voltage is sensed in the energy-supply system or at the energy store, and from that, a dispersion of the voltage is ascertained and compared to a threshold value in order to check the plausibility of a missing electrical connection of the energy store to the energy-supply system. The reliability of the detection, especially in safety-related energy-supply systems, may be further improved by this redundancy.

Additional expedient developments are described herein.

BRIEF DESCRIPTION OF THE DRAWINGS

Various exemplary embodiments are described in greater detail in conjunction with the figures.

DETAILED DESCRIPTION OF EXAMPLE EMBODIMENTS

Figure 1:
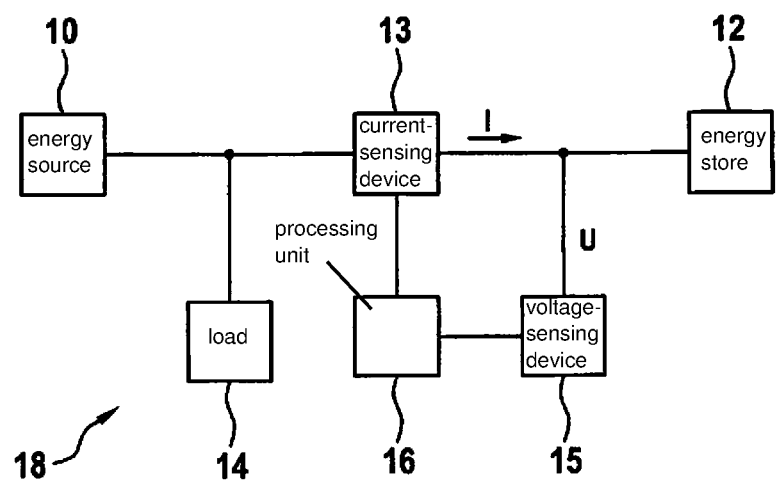
FIG. 1 shows a block diagram of an energy-supply system.

FIG. 1 shows a part of an electrical energy-supply system 18 by way of example. Energy-supply system 18 is made up of at least one energy source 10, at least one energy store 12, at least one current-sensing device 13, at least one load 14 and at least one processing unit 16. Optionally, a voltage-sensing device 15 could be provided. Energy source 10 is connected to energy store 12. Load 14 is connected electrically to energy source 10 as well as to energy store 12. Flowing current I is determined by current-sensing device 13, which is positioned between energy source 10 and energy store 12, for example. Voltage-sensing device 15 taps voltage U dropping at energy store 12. Processing unit 16 uses current I, ascertained by current-sensing device 13, for further evaluation. Optionally, processing unit 16 additionally evaluates voltage U. To that end, processing unit 16 is connected to current-sensing device 13 and/or voltage-sensing device 15 for the transmission of the measured values of current I and/or of voltage U. Energy-supply system 18 could be part of an electrical system of a motor vehicle.

As an example, in the case of a motor vehicle, energy source 10 may be a generator or a DC/DC converter. For instance, a battery or a capacitor or other energy store could be used as energy store 12. In a motor vehicle, a brake system, a steering system, a lighting system, a drive system or a comfort system or others may be used as load 14. For example, load 14 is a system relevant for driving safety.

Figure 2:
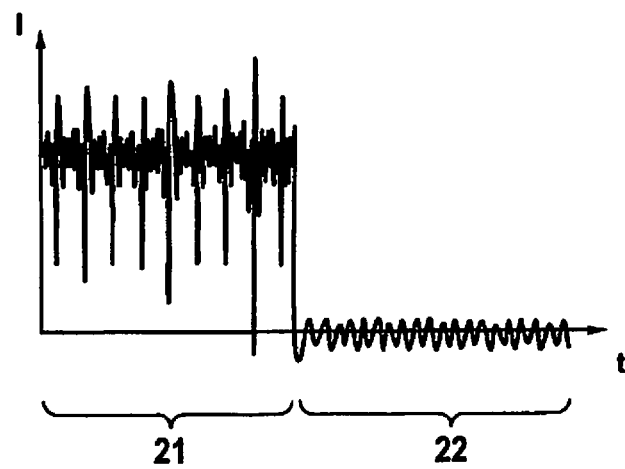
FIG. 2 shows a typical current profile as a function of time.
Figure 3:
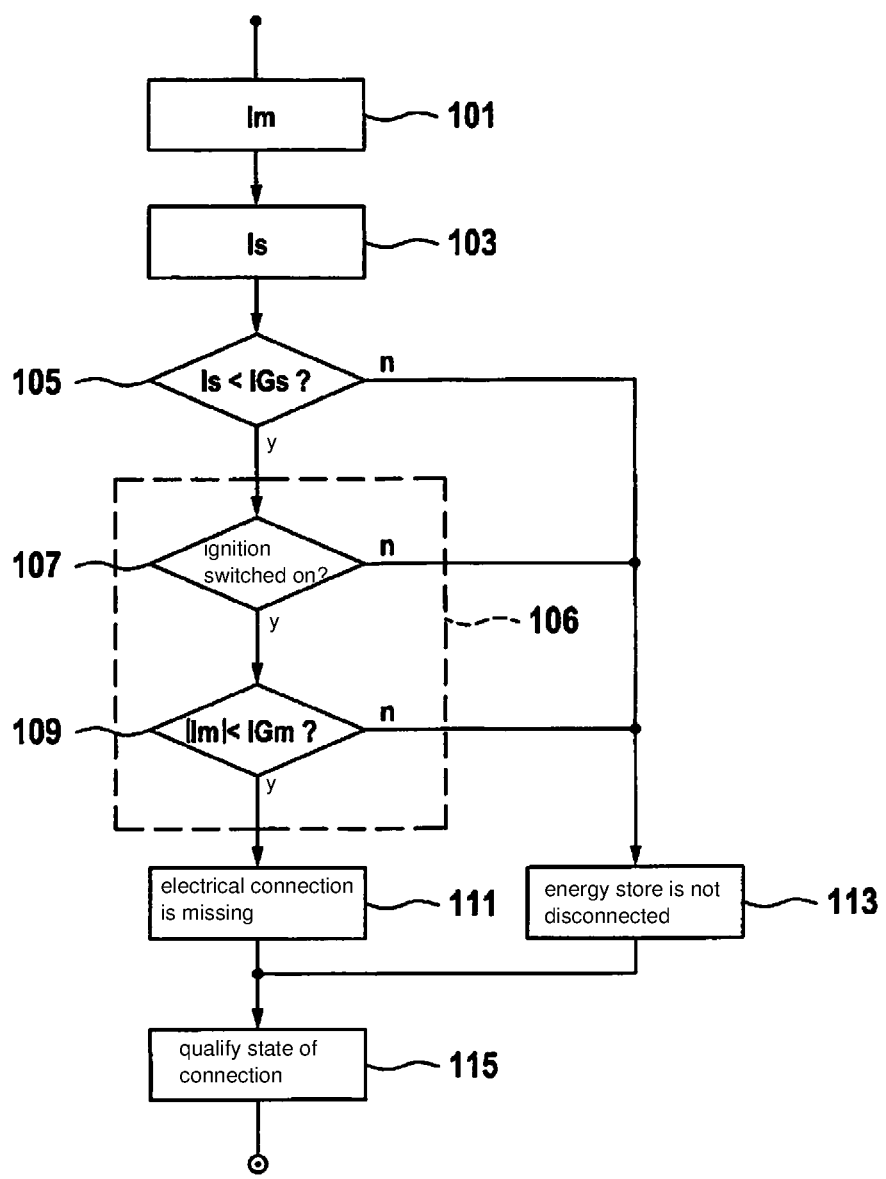
FIG. 3 shows a flowchart of the example method.

FIG. 2 shows illustratively the time characteristic of current I in energy-supply system 18. Typically, connected loads 14 are not active continuously and/or also not with constant performance requirements. This leads to continuous fluctuations of currents I and voltages U in energy-supply system 18. Such a typical current profile is shown in a first phase 21 in FIG. 2. In this context, abrupt changes in the power required by loads 14 are buffered via energy store 12, since energy source 10 typically reacts substantially more sluggishly to changes in the power requirement.

If energy store 12 is now disconnected from energy-supply system 18, a typical current profile in a further phase 22 results, as indicated in FIG. 2. In this case, the buffer function of energy store 12 is lost. As a consequence, it is no longer possible to compensate for abrupt changes in the power requirement in energy-supply system 18 and/or energy source 10 is not able to cover the increased power demand. The result is that loads 14 may be undersupplied. Correspondingly, their functions may be restricted. This is especially critical for loads 14 which are necessary for the operational safety of the overall system. It is noticeable that dispersion Is of current I is greater in first phase 21 than in second phase 22. This fact is utilized in the evaluation described in the following.

In order to activate or enable expanded and/or safety-related functions in the overall system, such as automatic driving-assistance systems, for example, it is necessary to reliably detect the presence of connected energy store 12. It is likewise necessary to quickly detect the absence of the connection of energy store 12 to energy-supply system 18, in order to deactivate expanded and/or safety-related functions possibly already activated in the overall system, or to transfer them into a safe state.

The presence or absence (the existing or missing electrical connection) of one or more energy stores 12 in an energy-supply system 18 may be detected by sensing and evaluating voltages U and/or currents I in energy-supply system 18.

If one of energy stores 12 becomes disconnected from energy-supply system 18, current I through energy store 12 then changes to zero; voltage U at energy store 12 assumes a constant voltage level U0 corresponding to the charge state. Voltage Uv in energy-supply system 18 shows an increase of fluctuations Uvs due to the missing buffer function of energy store 12.

The method provides for the continuous sensing of current I of energy store 12, and from that, deriving a measure for dispersion Is of current I. The measure for dispersion Is is subsequently compared to a threshold value IGs. If the measure for dispersion Is is less than respective threshold value IGs, then energy store 12 is disconnected electrically from energy-supply system 18. If dispersion Is is greater than threshold value IGs, then energy store 12 is connected to energy-supply system 18. In this context, it is advantageous to select threshold value IGs similar to the uncertainty in the sensing. Typically, this lies in the range of 1 mA to 500 mA.

The method steps of one possible exemplary embodiment are presented in a flowchart. For example, these method steps could be carried out in processing unit 16. Thus, to begin with, mean value Im of current I is calculated in a step 101. By preference, it is the average current of energy store 12, preferably the average battery current. The determination of mean value Im is advantageous as a measure for an expected value E(I) of current I, for the subsequent determination of dispersion Is of current I. If necessary, mean value Im is updated continuously or determined for a defined period of time. The customary methods for determining mean value may be used in this connection.

Dispersion Is is subsequently calculated in a step 103. Dispersion Is is a measure for the magnitude and/or frequency of a deviation of the measured values of current I from mean value Im of current I. For instance, the variance (Var) of current I may be used as dispersion Is. This is accomplished according to known stochastic determination methods, e.g., via the formula $Var(I)=E(I-E(I)^2)$, where E (I) denotes the expected value for current I, for example, mean value Im of current I. Alternatively, the standard deviation determined by extracting the root of the variance of current I, the noise, a measure for the ripple or other suitable variables could also be used in step 103 for dispersion Is of current I.

In subsequent query 105, dispersion Is determined in step 103 is compared to threshold value IGs. If dispersion Is is less than threshold value IGs, query 107 follows, otherwise step 113.

Preferably, threshold value IGs is selected in such a way that it lies in the range of the system-inherent dispersion (variance, standard deviation, noise) of the sensor, here, for example, current-sensing device 13. For instance, threshold value IGs lies in the area of 2.48 mA$^2$ (variance), or in the case of a standard deviation in the area of 50 mA. Typically, threshold value IGs lies in the range of 1 mA to 500 mA. If dispersion Is falls below threshold value IGs, this indicates that energy store 12 was disconnected. In addition, this is checked for plausibility by optional further steps 107, 109.

In step 107, it is queried whether the ignition of the vehicle is switched on. If this is not the case, one arrives at step 113. If the ignition of the vehicle is switched on, one arrives at query 109. The query concerning the ignition is exemplary for an ascertainment of the state of the vehicle or of energy-supply system 18, as to whether the vehicle is at rest. If the ignition is switched off, one arrives at step 113. False detections are thereby prevented, when the vehicle is inactive. For example, the following information may also be utilized for determining the state: position of the key, vehicle state, engine state, state of individual energy sources, state of individual loads 14, state of safety-related systems. If such an inactive state is recognized, either the determination of mean value Im or of dispersion Is is prevented completely, or else an undershoot does not lead to a corresponding conclusion, that energy store 12 is disconnected erroneously from energy-supply system 18.

In query 109, the amount value of mean value Im of current I is compared to a threshold value IGm. If the amount of mean value Im of current I is less than this threshold value IGm, step 111 follows. If the amount of mean value Im of current I is greater than or equal to threshold value IGm, one arrives at step 113. By preference, threshold value IGm is selected as a function of an offset error of the sensor, that is, of current-sensing device 13. For example, threshold value IGm lies in the range of 1 mA to 500 mA, e.g., on the order of 135 mA.

If step 111 is reached, it is assumed that energy store 12 is disconnected, that is, an electrical connection of energy store 12 is missing. On the other hand, if step 113 is reached, it is assumed that energy store 12 is not disconnected. In both cases, step 115 follows.

In step 115, the state of the connection of energy store 12, determined in previous steps 111, 113, is qualified. For example, if the presence of state 111 (energy store 12 is disconnected) continues to be ascertained or verified within a certain qualification time tq, a state thus qualified is communicated to a primary control, for instance, which initiates appropriate measures. Qualification time tq may be set depending on the desired safety requirements, and could be on the order of 100 ms to 30 s, 60 s or 120 s, for instance. Therefore, the state "energy store 12 disconnected" must thus exist for the duration of tq, e.g., for 60 seconds, until this state is transmitted as qualified to a higher-level system, for instance. If the state was qualified, dequalification time td then runs. Otherwise, only qualification time tq is reset. If a change of the state takes place for the duration of a period of time td (dequalification time), there is a change back again to state 113 (energy store 12 not disconnected), without state 111 (energy store 12 disconnected), which existed in the meantime, having been communicated to the higher-level system. For example, dequalification time td could be on the order of 1 s. Step 115 could also only be carried out optionally or could be omitted altogether.

Query 107 as well as query 109 following it are parts of an optional block 106, which is not absolutely necessary. Alternatively, only individual queries 107, 109 of this optional block 106 could follow query 105, as well.

An alternative embodiment provides for dispensing with the determination (step 101) and/or the evaluation (query 109) of the measure for mean value Im, if a continuous excitation is ensured through energy-supply system 18. Preferably, the excitation is greater than threshold value IGs for the measure of dispersion Is. Excitation is understood to be a driving in energy-supply system 18 and/or of loads 14 which leads to a change of current I. For example, to this end, loads 14 could be switched on briefly or continuously. Alternatively, changes could be made in the setpoint values, especially for the current, via the setting of suitable voltage setpoint values, for example. In this connection, the change in current I should turn out to be greater than threshold value IGs.

An alternative embodiment provides for requesting an excitation, which is greater than threshold value IGs, of energy-supply system 18, if the measure of dispersion Is is less than the threshold value of dispersion IGs. A false detection is thereby ruled out.

In a further embodiment, in addition, at least one voltage U is sensed in energy-supply system 18 or at energy store 12, and used as a redundant channel for detecting status. The reliability of the device and of the method may be improved by this redundancy, especially in safety-related energy-supply systems 18. Voltage U in energy-supply system 18 may be sensed both at energy source 10, a load 14 or energy store 12. A measure for dispersion Us of voltage U is derived from sensed voltage U. The measure for dispersion Us is compared to at least one, preferably a plurality of threshold values UGs. If the measure for dispersion Us is less or greater (depending on the location of the implemented measurement of voltage U or where the interruption of voltage U occurs) than a threshold value UGs, then the connection between voltage-sensing device 15 and at least one load 14 is interrupted. If the measure for dispersion Us is greater or less than a threshold value UGs, then the connection to at least one energy store 12 is interrupted. This additional information about the state of energy-supply system 18 is linked to the information from the current sensing, with the aim of permitting a more reliable statement about the state of energy-supply system 18. For example, the absence of energy store 12 may be indicated to the higher system level, if both or one of the two methods detect(s) a disconnection.

In the event of an uncertain informational value, a further alternative provides for adopting a safe state. A safe state is a state which does not signify the presence of energy store 12. For example, the absence of energy store 12 could be indicated to the higher system level. In particular, the safe state could be adopted during the initialization of the system, during qualification time tq or in the case of a counter state from a redundant method.

For example, the device and the method could be used in an electronic battery sensor. It is a sensor which determines current I and/or voltage U of energy store 12, preferably a battery, and from that, calculates the state of energy store 12 (e.g., the state of charge SOC, the state of health SOH) according to a suitable algorithm which is based on a model of energy store 12, for instance. Further variables like, e.g., temperature T of energy store 12 could also be taken into account here. Thus, the battery sensor already includes a current-sensing device 13 and/or a voltage-sensing device 15, as well as the corresponding evaluation intelligence, which could be used for the realization of processing unit 16, as well.

The method and device, respectively, could also be integrated into other products or spread among several products.

For example, integration in energy stores 12 like batteries, or in generators, converters or the energy management would be possible.

The device and method are particularly suitable for use in an electrical system of a motor vehicle, especially for detecting whether a battery is still connected to the electrical system. However, their use is not limited to this; rather, they may be employed for any energy-supply systems 18 as desired.

What is claimed is:

1. A method for detecting a missing electrical connection of an energy store to an energy-supply system, the energy-supply system being an electrical system of a motor vehicle, the method comprising:
    sensing, by at least one current-sensing device, at least one electrical current flowing in the energy-supply system or energy store;
    determining at least one dispersion of the current, wherein the dispersion is a measure of a magnitude and/or frequency of a deviation of sensed values of the current from a mean value of the current;
    comparing the determined dispersion to at least one threshold value; and
    detecting a missing electrical connection of the energy store to the energy-supply system in response to the comparison indicating that the determined dispersion is below the threshold.

2. The method as recited in claim 1, wherein the threshold value: (i) is a function of a dispersion of the current-sensing device, and/or (ii) lies in the range of 1 mA to 500 mA.

3. The method as recited in claim 1, further comprising:
    determining a mean value of the current; and
    comparing the mean value of the current to a second threshold value;
    wherein the determining the detection of the missing electrical connection of the energy store to the energy-supply system is further based on the comparison of the mean value indicating that the mean value is below the second threshold value.

4. The method as recited in claim 1, wherein a missing electrical connection between the energy store and the energy-supply system is inferred only if the missing electrical connection is recognized for a certain period of time on the order of 100 ms to 120s.

5. The method as recited in claim 1, wherein a state in which a missing electrical connection between the energy store and the energy-supply system is inferred, is terminated if a missing electrical connection between the energy store and the energy-supply system is no longer inferred within a predetermined period of time.

6. The method as recited in claim 1, wherein an idle state of (i) the energy-supply system, and/or (ii) the motor vehicle, is taken into account to further check a plausibility of a missing electrical connection between the energy store and the energy-supply system.

7. The method as recited in claim 1, wherein the energy-supply system is excited in such a way that the current is changed by a value which is greater than the threshold value for the dispersion.

8. The method as recited in claim 7, wherein the excitation of the energy-supply system is carried out when a previously ascertained dispersion is less than the threshold value for the dispersion.

9. The method as recited in claim 1, further comprising:
    sensing at least one voltage in the energy-supply system;
    determining a dispersion of the voltage based on the sensed voltage;
    comparing the dispersion voltage to a threshold value; and
    determining a plausibility of a missing electrical connection of the energy store and the energy-supply system, based on the comparison.

10. The method as recited in claim 1, wherein the dispersion is a measure of a magnitude of the deviation of the sensed values of the current from the mean value of the current.

11. The method as recited in claim 1, wherein the dispersion is determined as a variance of the current.

12. The method as recited in claim 1, wherein the dispersion is determined as a standard deviation of the current.

13. The method as recited in claim 1, wherein the dispersion is determined as a noise level of the current.

14. The method as recited in claim 1, wherein the dispersion is determined as a ripple of the current.

15. A device for detecting a missing electrical connection of an energy store to an energy-supply system, the electrical-supply system being an electrical system of a motor vehicle, the device comprising:
    at least one current-sensing device configured to sense at least one electrical current flowing in the energy-supply system or the energy store; and
    at least one processing unit configured to (i) determine a dispersion of the current, the dispersion being determined is a measure of a magnitude and/or frequency of a deviation of sensed values of the current from a mean value of the current, (ii) to compare the determined dispersion of the current to at least one threshold value, and (iii) to detect a missing electrical connection of the energy store to the energy-supply system in response to the comparison indicating that the determined dispersion is below the threshold.

16. The device as recited in claim 15, wherein the device is configured to determine a mean value of the current, and compare the mean value of the current to a second threshold value, wherein the detection of the missing electrical connection of the energy store to the energy-supply system is further based on the comparison of the mean value indicating that the mean value is below the second threshold value.

* * * * *